(12) United States Patent
Kuhns

(10) Patent No.: US 7,102,522 B2
(45) Date of Patent: Sep. 5, 2006

(54) TAMPER-INDICATING RADIO FREQUENCY IDENTIFICATION ANTENNA AND STICKER, A RADIO FREQUENCY IDENTIFICATION ANTENNA, AND METHODS OF USING THE SAME

(75) Inventor: David W. Kuhns, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 381 days.

(21) Appl. No.: 10/328,989

(22) Filed: Dec. 24, 2002

(65) Prior Publication Data

US 2004/0119593 A1 Jun. 24, 2004

(51) Int. Cl.
*G08B 13/14* (2006.01)
(52) U.S. Cl. .............. 340/572.7; 340/572.1; 340/572.6; 343/700 MS; 343/790; 343/880; 343/895
(58) Field of Classification Search ............ 340/572.7, 340/571.1, 572.6, 572.1; 235/492; 343/700 MS, 343/790, 880, 895
See application file for complete search history.

(56) References Cited

U.S. PATENT DOCUMENTS

| | | | |
|---|---|---|---|
| 2,407,680 A | 9/1946 | Palmquist et al. | |
| 2,721,152 A | 10/1955 | Hopf et al. | |
| 2,757,443 A | 8/1956 | Steigerwalt et al. | |
| 2,963,748 A | 12/1960 | Young | |
| 3,190,178 A | 6/1965 | McKenzie | |
| 3,628,243 A | 12/1971 | Pohl et al. | |
| 3,800,020 A | 3/1974 | Parfet | |
| 4,247,498 A | 1/1981 | Castro | |
| 4,403,107 A | 9/1983 | Hoffman | |
| 4,588,258 A | 5/1986 | Hoopman | |
| 4,614,837 A | 9/1986 | Kane et al. | |
| 4,649,397 A | 3/1987 | Heaton et al. | |
| 4,799,983 A | 1/1989 | Desai | |
| 4,867,881 A | 9/1989 | Kinzer | |
| 5,032,450 A | 7/1991 | Rechlicz et al. | |
| 5,059,485 A | 10/1991 | Parr et al. | |
| 5,061,438 A | 10/1991 | Lillie et al. | |
| 5,087,494 A | 2/1992 | Calhoun et al. | |
| 5,196,262 A | 3/1993 | Schwarz et al. | |
| 5,282,650 A * | 2/1994 | Smith et al. .................. 283/81 |
| 5,346,750 A | 9/1994 | Hatakeyama et al. | |
| 5,450,235 A | 9/1995 | Smith et al. | |
| 5,468,540 A | 11/1995 | Lu | |
| 5,510,171 A | 4/1996 | Faykish | |
| 5,517,195 A | 5/1996 | Narlow et al. | |

(Continued)

FOREIGN PATENT DOCUMENTS

FR    2 823 310    10/2002

(Continued)

OTHER PUBLICATIONS

"Glossary of Terms Used in the Pressure Sensitive Tape Industry", provided by the Pressure Sensitive Tape Council, Aug., 1985.

(Continued)

*Primary Examiner*—Tai T. Nguyen
(74) *Attorney, Agent, or Firm*—Melissa E. Buss

(57) ABSTRACT

A tamper-indicating radio frequency identification device made of densified metal powder and to a sticker including the same device. The present invention also relates to radio frequency identification antenna made of densified metal powder and to a sticker including the same antenna. The present invention also relates to methods of indicating that a radio frequency identification antenna or sticker has been tampered with.

79 Claims, 3 Drawing Sheets

U.S. PATENT DOCUMENTS

| | | | |
|---|---|---|---|
| 5,528,222 A | 6/1996 | Moskowitz et al. | |
| 5,591,527 A | 1/1997 | Lu | |
| 5,761,801 A | 6/1998 | Gebhardt et al. | |
| 5,781,110 A | 7/1998 | Habeger, Jr. et al. | |
| 5,817,834 A | 10/1998 | Kameswaran | |
| 6,004,646 A | 12/1999 | Ohno et al. | |
| 6,050,622 A | 4/2000 | Gustafson | |
| 6,121,880 A | 9/2000 | Scott et al. | |
| 6,164,551 A | 12/2000 | Altwasser | |
| 6,271,793 B1* | 8/2001 | Brady et al. | 343/700 MS |
| 6,353,420 B1 | 3/2002 | Chung | |
| 6,384,727 B1 | 5/2002 | Diprizio et al. | |
| 6,421,013 B1 | 7/2002 | Chung | |
| 6,459,588 B1 | 10/2002 | Morizumi et al. | |
| 6,522,308 B1 | 2/2003 | Mathieu | |
| 6,591,496 B1 | 7/2003 | Koskenmaki et al. | |
| 6,778,139 B1* | 8/2004 | Suzuki et al. | 343/700 MS |
| 2002/0093426 A1* | 7/2002 | Jackson et al. | 340/572.7 |
| 2002/0142121 A1 | 10/2002 | Hingsen-Gehrmann et al. | |
| 2003/0031819 A1* | 2/2003 | Adams et al. | 428/40.1 |
| 2003/0067389 A1 | 4/2003 | Look | |
| 2003/0075608 A1* | 4/2003 | Atherton | 235/492 |
| 2003/0091789 A1 | 5/2003 | Koskenmaki et al. | |
| 2003/0111542 A1 | 6/2003 | Look | |
| 2004/0046663 A1 | 3/2004 | Jesser | |

FOREIGN PATENT DOCUMENTS

| | | |
|---|---|---|
| JP | 11-353443 | 12/1999 |
| JP | 2000-48147 | 2/2000 |
| JP | 2000-105806 | 4/2000 |
| JP | 2000-105807 | 4/2000 |
| JP | 2000-151459 | 5/2000 |
| JP | 2000-194810 | 7/2000 |
| JP | 2000-194820 | 7/2000 |
| JP | 2000-338879 | 12/2000 |
| WO | WO 88/09541 A1 | 12/1988 |
| WO | WO 97/21118 A1 | 6/1997 |
| WO | WO 01/26180 | 4/2001 |
| WO | WO 01/45935 | 6/2001 |
| WO | WO 01/71848 A1 | 9/2001 |
| WO | WO 02/11094 A1 | 2/2002 |
| WO | WO 02/45042 A1 | 6/2002 |
| WO | WO 02/077939 A1 | 10/2002 |

OTHER PUBLICATIONS

Rodal, "Exploring Volume Change, Angular Distortion in a Calendaring Nip," *Pulp & Paper*, 1993, pp. 1-8.

U.S. Appl. No. 09/952,239, filed Sep. 10, 2001, Method for Making Conductive Circuit Using Powdered Metals.

U.S. Application entitled "Forming Electromagnetic Communication Circuit Components Using Densified Metal Powder," U.S. Appl. No. 10/377,960, filed Mar. 1, 2003, Kuhns et al.

* cited by examiner

TAMPER-INDICATING RADIO FREQUENCY IDENTIFICATION ANTENNA AND STICKER, A RADIO FREQUENCY IDENTIFICATION ANTENNA, AND METHODS OF USING THE SAME

TECHNICAL FIELD

The present invention relates to a tamper-indicating radio frequency identification device made of densified metal powder and to a sticker including the same antenna. The present invention also relates to radio frequency identification antenna made of densified metal powder and to a sticker including the same antenna. The present invention also relates to methods of indicating that a radio frequency identification antenna or sticker has been tampered with.

BACKGROUND OF THE INVENTION

Radio frequency identification technology has become widely used in virtually every industry, including transportation, manufacturing, waste management, postal tracking, airline baggage reconciliation, and highway toll management. An RFID system is made up of two components, the transponder and the interrogator or reader. The essential components of a transponder are the data carrying device—generally referred to as an integrated circuit or an electronic microchip, and a coupling element—such as an antenna. A transponder that contains its own power supply, generally a battery, is know as an active tag, while a transponder that does not contain its own power supply is known as a passive tag, sticker or label. The interrogator or reader contains a radio frequency module (transmitter and receiver), a control unit and a coupling element—an antenna. Power and data exchange between the transponder and the interrogator are achieved through magnetic or electromagnetic fields.

An example of a radio frequency identification sticker is disclosed in U.S. Pat. No. 6,121,880 (Scott et al.), "Sticker Transponder for Use on Glass Surface." This patent discloses a sticker transponder adapted to be affixed to a glass surface, such as a vehicle windshield, including a RFID transponder enabling the storage and retrieval of vehicle related data. The sticker transponder comprises a flexible circuit substrate having an antenna formed thereon and a transponder circuit disposed on the substrate and coupled to the antenna. An adhesive layer is coupled to a first surface of the flexible circuit substrate. An indicia layer is coupled to a second surface of the flexible circuit opposite from the first surface. The indicia layer comprises a space permitting indicia to be printed thereon. The antenna has a characteristic impedance defined in part by a dielectric constant of the glass surface. As a result, a proper impedance match between the antenna and the transponder circuit is achieved only when the sticker is affixed to the glass surface. The sticker transponder further comprises a release liner affixed to the adhesive layer, the release liner being selectively removable to permit the sticker transponder to be affixed to the glass surface. The transponder circuit further includes a memory having a read-only portion and a re-writable portion.

An example of a tamper indicating radio frequency identification label is disclosed in PCT Publication WO 01/71848A1 (Atherton), "A Tamper Indicating Radio Frequency Identification Label." This publication discloses a label which may include RFID components and a tamper track coupled to the RFID components. The tamper track should be constructed from a destructible conducting path. Additionally, the tamper rack can be formed such that it is damaged when the label is tampered. In one embodiment, adhesion characteristics of the tamper track (102) are adapted to break apart the tamper track when the label is tampered, for example, by removal from an object. The RFID components may retain their RF capability and detect when the tamper track (102) has been damaged to indicate that the label has been tampered. Alternatively, the RFID capability of the RFID components may be disabled when the tamper track is damaged, indicating tampering.

SUMMARY OF THE INVENTION

One aspect of the present invention provides a tamper-indicating radio frequency identification device. The radio frequency identification device comprises: a substrate including a first major surface and a second major surface opposite the first major surface; and a radio frequency identification antenna attached to the first major surface of the substrate, where said antenna comprises densified metal powder. In one preferred embodiment of the above tamper-indicating radio frequency identification device, the antenna responds to a signal, and after the tamper-indicating radio frequency identification antenna is bent equal to or less than a radius of 25 mm, the tamper-indicating radio frequency identification antenna does not respond to the signal.

Another aspect of the present invention provides a tamper-indicating radio frequency identification sticker. The tamper-indicating radio frequency identification sticker comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate. In one preferred embodiment of the above tamper-indicating radio frequency identification sticker, the antenna responds to a signal, and after the tamper-indicating radio frequency identification antenna is bent equal to or less than a radius of 25 mm, the tamper-indicating radio frequency identification antenna does not respond to the signal.

Another aspect of the present invention provides a method of indicating that a radio frequency identification sticker has been tampered. The method comprises the steps of: attaching a tamper-indicating radio frequency identification sticker to a first surface, where the tamper-indicating radio frequency identification sticker, comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate; sending a signal to the tamper-indicating radio frequency identification sticker attached to the first surface; receiving a response from the antenna, removing the tamper-indicating radio frequency identification sticker from the first surface; and sending the signal to the tamper-indicating radio frequency identification sticker and not receiving a response from the antenna. In one preferred embodiment of the above method, the removing step comprises bending the tamper-indicating radio frequency identification antenna less than or equal to a radius of 25 mm.

Yet another aspect of the present invention provides an alternative method of indicating a radio frequency identification sticker has been tampered. This method comprises the steps of: attaching a tamper-indicating radio frequency identification sticker to a first surface, where the tamper-indicating radio frequency identification sticker, comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate; measuring a first resistance in the antenna; bending the tamper-indicating radio frequency identification sticker less than or equal to a radius of 25 mm; and measuring a second resistance in the antenna that is higher than the first resistance of the antenna.

Another aspect of the present invention provides another alternative method of indicating a radio frequency identification sticker has been tampered. This method comprises the steps of: attaching a tamper-indicating radio frequency identification sticker to a first surface, where the tamper-indicating radio frequency identification sticker, comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate; measuring a first conductivity in the antenna; bending the tamper-indicating radio frequency identification sticker less than or equal to a radius of 25 mm; and measuring a second conductivity in the antenna that is lower than the first conductivity of the antenna.

Another aspect of the present invention provides yet another alternative method of indicating a radio frequency identification sticker has been tampered. This method comprises the steps of: attaching a tamper-indicating radio frequency identification sticker to a first surface, where the tamper-indicating radio frequency identification sticker, comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate; measuring a first conductivity in the antenna; bending the tamper-indicating radio frequency identification sticker less than or equal to a radius of 25 mm; and measuring a second conductivity that indicates that the antenna is nonconductive.

Another aspect of the present invention provides another alternative method of indicating a radio frequency identification sticker has been tampered. This method comprises the steps of: attaching a tamper-indicating radio frequency identification sticker to a first surface, where the tamper-indicating radio frequency identification sticker, comprises: a substrate including a first major surface and a second major surface opposite the first major surface; and a radio frequency identification antenna attached to the first major surface of the substrate, where said antenna comprises densified metal powder; a first integrated circuit attached to the antenna; and a first layer of adhesive attached to the substrate; bending the tamper-indicating radio frequency identification sticker less than or equal to a radius of 25 mm; and forming a fracture in the radio frequency identification antenna.

Another aspect of the present invention provides another alternative method of indicating a radio frequency identification sticker has been tampered. The method comprises the steps of: attaching a tamper-indicating radio frequency identification sticker to a first surface, where the tamper-indicating radio frequency identification sticker, comprises: a substrate including a first major surface and a second major surface opposite the first major surface; and a first radio frequency identification antenna attached to the first major surface of the substrate where said antenna comprises densified metal powder; a first integrated circuit attached to the antenna; a second integrated circuit attached to the substrate, where the second integrated circuit comprises a second antenna; and a first layer of adhesive attached to the substrate; sending a signal to the tamper-indicating radio frequency identification sticker attached to the first surface; receiving a response from the first antenna and the second antenna; removing the tamper-indicating radio frequency identification sticker from the first surface; sending the signal to the tamper-indicating radio frequency identification sticker; and receiving a signal from the second antenna and not receiving a response from the first antenna.

Another aspect of the present invention provides a tamper-indicating radio frequency identification sticker. The tamper-indicating radio frequency identification sticker comprises: a substrate including a first major surface and a second major surface opposite the first major surface, where the substrate is selected from the group consisting of paper and materials that are at least about 10% compressible, and where the materials that are at least 10% compressible are selected from the group consisting of microporous materials, nonwoven materials and woven materials; and a radio frequency identification loop antenna attached to the first major surface of the substrate, where said antenna comprises densified metal powder, where the densified metal powder is selected from the group consisting of copper, tin, lead, silver, gold, platinum, aluminum, nickel, iron, steel, zinc and alloys and combinations thereof; and where the metal powder comprises metal particles in the shape of spheres, oblongs, and polyhedra; a first integrated circuit attached to the antenna; and a first layer of adhesive attached to the substrate; where the antenna responds to a signal sent a distance greater than 15 cm from the tamper-indicating radio frequency identification sticker, and where after the tamper-indicating radio frequency identification sticker is bent equal to or less than or equal to a radius of 25 mm, the tamper-indicating radio frequency identification antenna does not respond to the signal and the antenna comprises a fracture that is not visible to the naked eye.

Yet another aspect of the present invention provides a radio frequency identification antenna. The radio frequency identification antenna comprises: a substrate including a first major surface and a second major surface opposite the first major surface; and a radio frequency identification antenna attached to the first major surface of the substrate, where said antenna comprises densified metal powder.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The present invention will be further explained with reference to the appended Figures, wherein like structure is referred to by like numerals throughout the several views, and wherein:

FIG. 4b is cross-sectional view of the tamper-indicating radio frequency identification sticker of FIG. 4a a portion of the sticker is bent at a radius $R_2$, taken along line 4b in FIG. 6a;

DETAILED DESCRIPTION OF THE INVENTION

Figure 1:
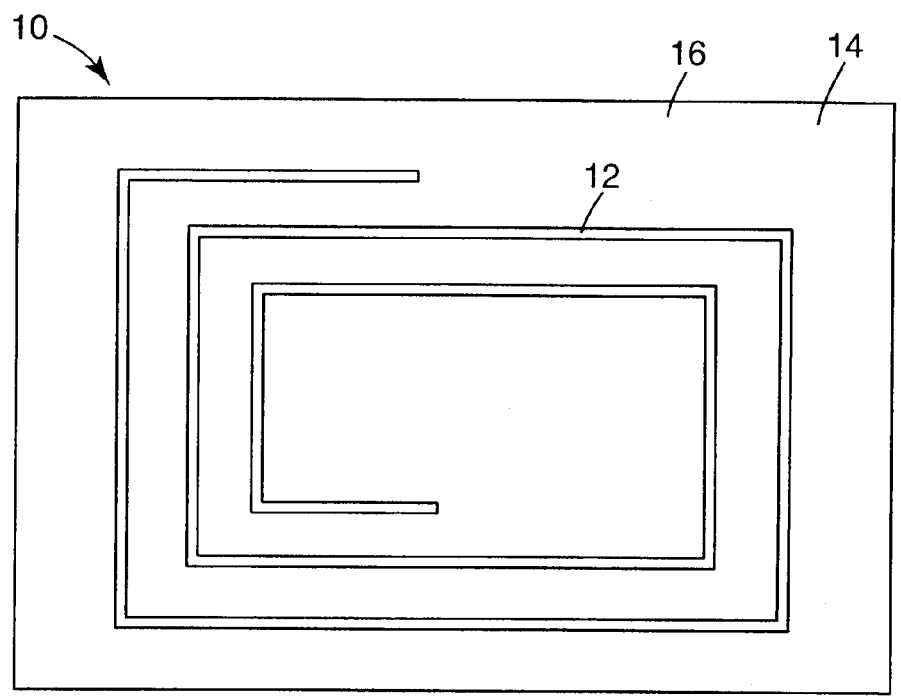
FIG. 1 is a top view of one embodiment of a radio frequency identification device.

FIG. 1 illustrates one preferred embodiment of a radio frequency identification ("RFID") device 10. The RFID device 10 includes a substrate 14, which has a first major surface 16 and a second major surface 18 opposite the first major surface (shown in FIG. 3a). The substrate 14 is preferably a compressible material. As used herein, compressible means that a substrate reduces in its dimension parallel to an applied pressure and that the total volume of the substrate is also reduced by a similar amount. When used herein as a quantitative measure, X % compressible means that the dimension of a substrate measured parallel to an applied pressure of 30 MPa is $[(100-X)/100]$ times its dimension in this direction at 0.07 MPa and the total volume of the substrate at 30 MPa is $[(100-X)/100]$ times its volume at 0.07 MPa. If the dimension change in the direction of the applied pressure and the volume change yield different values of X, then the smaller X of the two values is used to define the quantitative compressibility of the material. Preferably, following release of an applied pressure, substrates 14 still show dimension and volume changes of at least 10%, more preferably they show dimension and volume changes that are at least 50% of the percent compressibility observed at 30 MPa, and most preferably they maintain dimension and volume changes that are at least 75% of the percent compressibility achieved at 30 MPa.

Preferably, substrate 14 is made of paper and compressible fibrous and non-fibrous materials, including those manufactured from synthetic or naturally occurring polymers, or combinations thereof. Suitable forms of these substrates include nonwovens including dry-lay and wet-lay nonwovens, nonwovens made by melt-blown fiber, spun bond or spun lace processes, woven and knit fabrics, membranes, foams (preferably open-cell foams) and expanded webs, and webs comprised of cast fibers.

Paper is one preferred substrate 14 and a variety of papers are suitable, including, but not limited to, kraft paper, stationery paper, copier paper, filter paper, newsprint, cardstock, folder stock, printing paper, specialty papers, paper products such as pulp board and the like. Suitable papers may be made by various processes and may contain fillers, sizing agents, pigments, dyes, and others additives as known to those skilled in the art. Suitable papers may be calendered or non-calendered, processed to provide various finishes and coated or uncoated.

Suitable nonwoven substrates can include membranes or porous materials, such as, for example, ultrafiltration membranes, microporous materials, cast polymeric membranes, and thermally induced phase transition materials (TIPS), which are described in U.S. Pat. Nos. 4,247,498 and 4,867,881. One suitable substrate is a particle-filled, microporous material, commercially available from PPG Industries, Pittsburgh, Pa., under the trade designation Teslin. Teslin is described by its manufacturer as a dimensionally stable, polyolefin based, microporous, printing sheet with 60% of its weight including a non-abrasive filler and with 65% of its volume including air.

Suitable substrate materials may be fibrous and fiber-like materials including silk and cellulosic or lignocellulosic materials, such as for example, flax, hemp, cotton, jute, or synthetic cellulosic or lignocellulosic materials such as rayon.

Suitable substrates can be made from a variety of polymers, including thermoplastic, thermoset, elastomeric, and crosslinked polymers. Examples of suitable polymers include polyamides, polyurethanes, polyolefins (e.g., polyethylene and polypropylene), polystyrene, polycarbonate, polyethers, polyvinylchloride, silicones, fluoropolymers, polysulfones, nylons, cellulose acetate, ethylenically unsaturated polymers, and suitable combinations thereof.

RFID device 10 includes a densified metal powder layer 12. The densified metal powder layer 12 in FIG. 1 is illustrated in a pattern of a loop. However, the densified metal powder layer may be in any pattern. The pattern of densified metal powder layer 12 is formed on the substrate by at least one of the methods taught in U.S. patent application Ser. No. 09/952,239, "Method for Making Conductive Circuits Using Powdered Metals," (Koskenmaki et al.), filed on) Sep. 10, 2001, the entirety of which is hereby incorporated by reference, and which is co-owned by the assignee of the present invention. To summarize at least one of these methods described in this application, the densified metal powder layer 12 is formed on the substrate 14 by a multiple step process. First, a metal powder composition is deposited onto the substrate 14. Second, a capture process step is performed by applying pressure to the powder composition and substrate with a hydraulic press with a die having projections or male portions against a platen. The projections of die are shaped to produce a patterned layer of densified metal powder 12 in the plane of the substrate 14. Any pattern may be machined onto the die and thereby imparted to metal powder composition on substrate 14. During this capture step, the captured metal powder composition is formed into a pattern and adheres to the substrate 14, while the metal powder composition outside the projections remains uncaptured. The processing conditions used to capture the pattern of densified metal powder 12 will vary widely depending on the metal powders selected for use in the metal powder composition, as well as the properties of the substrate material. Temperatures, pressures and application times should be selected to substantially minimize, and preferably eliminate, damage to the substrate 14, such as melting, warping, buckling, blistering, or decomposing. Preferably, the platen is maintained at a temperature between 50 and −25° C., and the die or at least the raised portions of the die, are maintained at a temperature between 20 and 250° C., preferably between 20 and 200° C. Useful processing pressure is in the range of 20 MPa to 400 MPa, and pressure is maintained for up to 300 seconds. Preferably, the platen and the die are maintained at about 20 to 25° C., and a pressure between about 35 MPa and 200 MPa is maintained for no more than about 60 seconds.

Third, the residual, unadhered metal powder composition that is uncaptured may optionally be substantially removed from the substrate by a variety of conventional methods, for example, compressed air, vacuum, vibration, brushing, blowing, gravity, aqueous wash, and suitable combinations thereof.

Fourth, a densifying energy in the form of a second pressure is then applied with platens to the pattern of densified metal powder layer 12 to densify the pattern. Preferably, this densifying process step increases the adhesion of the pattern to the substrate 14 and makes the pattern more conductive. The second pressure may be applied as hydraulic pressure, and optionally heat, acoustic or microwave energy may be simultaneously or subsequently applied. Ultrasonic energy, heat or microwave energy may also be employed prior to the application of pressure, or may be employed alone to accomplish densification without the application of a second pressure. The densification step may be performed in a continuous process by such means, for example, as calendar rolls, a hot zone or a sonication zone, or in a batchwise or step-and-repeat process using, for example, a hydraulic press, a thermal or microwave oven, or an ultrasonic horn. Densification means that the metal particles have been compressed together with such high pressures that the metal particles are mechanically joined together very tightly, to the point where some of the particles may even be cold-welded together, but not sintered or annealed.

The pressure applied in the densification step is about 20 MPa to about 400 MPa, preferably about 60 MPa to 200 MPa. Densification at these pressures is conducted at temperatures from about 20° C. to 250° C., preferably about 50° C. to 200° C. most preferably about 100° C. to about 150° C. With application of other sources of densifying energy such as ultrasonic energy, different temperatures ranges may be preferred.

Lastly, the platen is removed, resulting in the RFID device 10 illustrated in FIG. 1 having a conductive metal pattern of densified metal powder layer 12 adhered on the first major surface 16 of the substrate 14.

The metal powder composition used to make the densified metal powder layer 12 described above preferably includes finely divided metal particles. The metal particles suitable for use in the metal powder composition include copper, tin, nickel, iron, steel, platinum, aluminum, silver, gold, lead, zinc and the like, and copper is particularly preferred. The metal powder composition may also include conductive non-metal powders, such as, for example, graphite. The metal powder composition may contain only one metal or it may contain two or more metals, in such combinations as a mixture of particles of two or more metals, particles comprising alloys, blends or mixtures, particles of one metal coated with a second metal, and the like. The shape of the particles in the metal powder composition can vary widely. The metal particles can be of the same shape or of different shapes and can be regularly or irregularly shaped. Exemplary particle shapes include, for example, spheres, oblongs, needles, dendrites, polyhedra (e.g., tetragons, cubes, pyramids and the like), prisms, flakes, rods, plates, fibers, chips, whiskers, and mixtures thereof. Similarly, the sizes of the metal particles in the metal powder composition can vary widely, and may include monodisperse particles, a multimodal distribution of particle sizes, or a broad distribution of particle sizes. Preferably, the particles in the metal powder composition have a mean particle size of approximately 0.1 to about 2000 um; preferably between about 0.2 um and about 1000 um; most preferably between about 1 um and about 500 um.

For the tamper-indicating feature of one of the present inventions, as explained below in reference to FIGS. 4a–4b, it is preferable to form densified metal powder layers which have reduced flexibility and may easily crack or fracture, especially upon bending. To achieve this feature, the metal powder compositions preferably include particle shapes which will more easily mechanically separate from each other or become undensified when the densified metal powder layer 12 (or the entire device 10) is bent at a radius less than or equal to 25 mm. For example, metal particles in the shape of spheres will most easily mechanically separate from each other or easily crack or fracture due to their smooth, round shape. In sharp contrast, densified metal powders made solely of metal particles only in the shape of dendrites (shaped like branches or trees) will tend to stay mechanically joined together and tend not to crack or fracture due to their ability to fasten together, even if the antenna is bent at a radius less than or equal to 25 mm. Metal powders in the shape of oblongs and polyhedra tend to easily mechanically separate from each other or easily crack or fracture, but not as easily as densified metal powders in the shape of spheres. Metal powders in the shape of flakes or needles also tend to mechanically separate from each other or easily crack or facture, but not as easily as densified metal powders in the shape of oblongs or polyhedra. The shape or combination of shapes of metal particles may be selected for the densified metal powder layer 12 to obtain the desired flexibility of the resulting densified metal powder layer 12 and to obtain a desired fracture in the densified metal powder layer 12 upon bending the antenna 10 a certain radius. For example, to obtain a densified metal powder layer that cracks or fractures very easily, particularly upon bending, metal powders in shapes of spheres are preferred. As another example, to obtain a densified metal powder layer that has more flexibility compared to the example above, but is still prone to cracks or fractures after bending, metal powders in shapes of oblongs or polyhedra, or combinations thereof are preferred.

Figure 2:
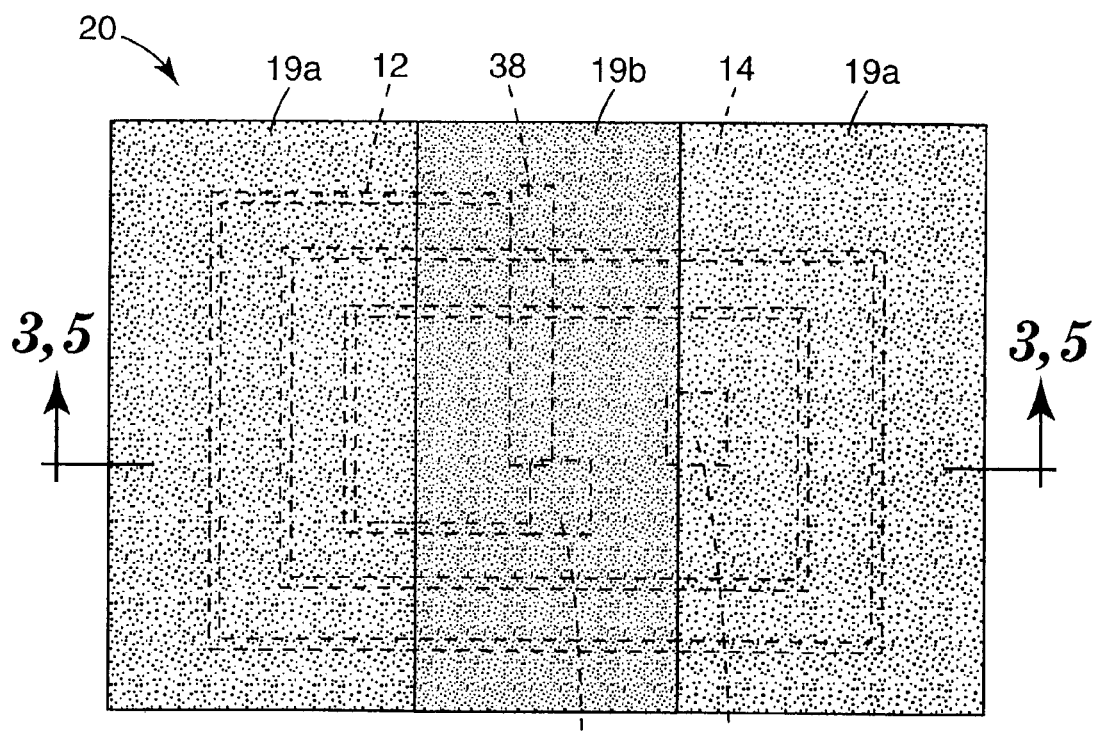
FIG. 2 is a top view of one embodiment of a tamper-indicating radio frequency identification sticker including the device of FIG. 1.
Figure 3A:
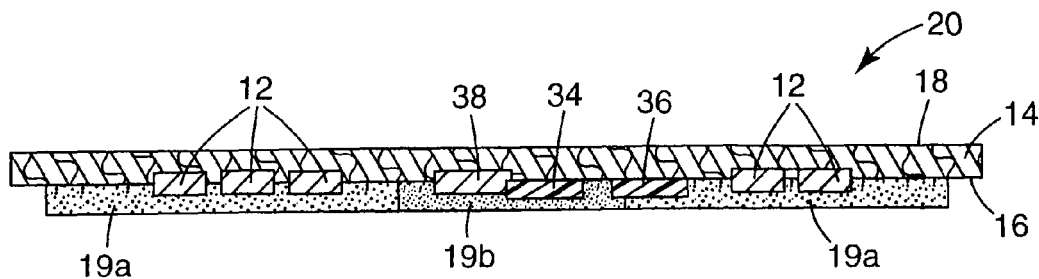
FIG. 3a is cross-sectional view of the tamper-indicating radio frequency identification sticker of FIG. 2 taken along line 3 in FIG. 2.

FIGS. 2 and 3a illustrate one embodiment of an RFID sticker, tag, or label 20, including the RFID device 10 of FIG. 1. The RFID sticker 20 includes a first integrated circuit 34 and a bridge 38. The first integrated circuit 34 is attached to one end of the pattern of densified metal layer 12, and the bridge 38 links the first integrated circuit 34 to the opposite end of the pattern of densified metal layer 12. The sticker 20 may optionally include a second integrated circuit 36, which preferably includes its own independent antenna 37 (shown in FIG. 6a). The RFID device 10 may be a passive antenna or an active antenna.

The RFID sticker 20 includes a layer of adhesive 19 on the sticker 20. The RFID sticker 20 may include an optional liner (not shown) on the layer of adhesive. Suitable adhesives for the layer of adhesive 19 include poly (alpha-olefin) adhesives, rubber-based adhesives; and acrylic-based adhesives such as reaction product of an acrylic acid ester and a reinforcing ethylenically unsaturated monomer. One preferable adhesive for the layer of adhesive 19 includes a pressure sensitive poly (alpha-olefin) adhesive. One well-known means of identifying pressure sensitive adhesives is the Dahlquist criterion. This criterion defines a pressure sensitive adhesive as an adhesive with a 1 second creep compliance greater than $1 \times 10^{-6}$ cm$^2$/dyne. (See "Handbook of Pressure Sensitive Adhesive Technology," Donald Sata (Ed.), $2^{nd}$ Edition, p. 172, Van Nostrand Reinhold, New York, N.Y., 1989). Alternatively, since modulus is the inverse of creep compliance, pressure sensitive adhesives may be defined as adhesives having a Young's modulus of less than $1 \times 10^6$ dynes/cm$^2$.) Another well-known means of identifying a pressure sensitive adhesive is that it is aggressively and permanently tacky at room temperature and firmly adheres to a variety of dissimilar surfaces upon mere contact without the need of more than finger or hand pressure. (See "Glossary of Terms Used in the Pressure Sensitive Tape Industry" provided by the Pressure Sensitive Tape Council, August, 1985.). Several examples of a suitable pressure sensitive adhesive are taught in "Handbook of Pressure Sensitive Adhesive Technology," Donald Sata (Ed.), $2^{nd}$ Edition, Van Nostrand Reinhold, New York, N.Y., 1989, which is hereby incorporated by reference.

In an alternative embodiment of the RFID sticker 20, the sticker 20 includes a layer of adhesive 19 having at least two portions 19a, 19b made from two different adhesives. For example, the first portion 19a of the adhesive layer 19 may include a first adhesive strength, and the second portion 19b of the adhesive layer 19 may include a second adhesive strength. The adhesive strengths are the strength of the bond between the layer of adhesive 19 and the surface it is adhered to. Preferably, the second adhesive strength is greater than the first adhesive strength, as explained below in reference to FIGS. 4a-4b. Alternatively, the first portion 19a and second portion 19b of the adhesive layer 19 may have different relative cohesive strengths. The cohesive strength of the adhesive is the strength of the adhesive to resist internal delamination. However, the sticker 20 may include any number of different portions of adhesives with differing or similar adhesive strengths and cohesive strengths. Examples of an adhesive for the first portion 19a and adhesives for the second portion 19b with differing adhesive strengths or different cohesive strengths are taught in "Handbook of Pressure Sensitive Adhesive Technology," Donald Sata (Ed.), $2^{nd}$ Edition, Van Nostrand Reinhold, New York, N.Y., 1989.

In yet another alternative embodiment, the adhesive could be stripe-coated or coated in any pattern across the substrate 14, to have portions of the substrate with adhesive and to leave portions of the substrate without adhesive. The stripe-coated adhesive or patterned adhesive may include any number of types of adhesives having similar or different adhesive strengths and cohesive strengths.

In FIGS. 2 and 3a, the adhesive layer 19 is illustrated as being in contact with the first major surface 16 of the substrate 14 and the densified metal layer 12. However, the adhesive layer 19 may instead be in contact with the second major surface 18 of the substrate, opposite the densified metal layer 12.

Although the densified metal powder layer 12 is illustrated in FIG. 3a as partially above and partially below the first major surface 16, the layer 12 could be all above, all below or coextensive with the major surface 16 of substrate 14.

Figure 3B:
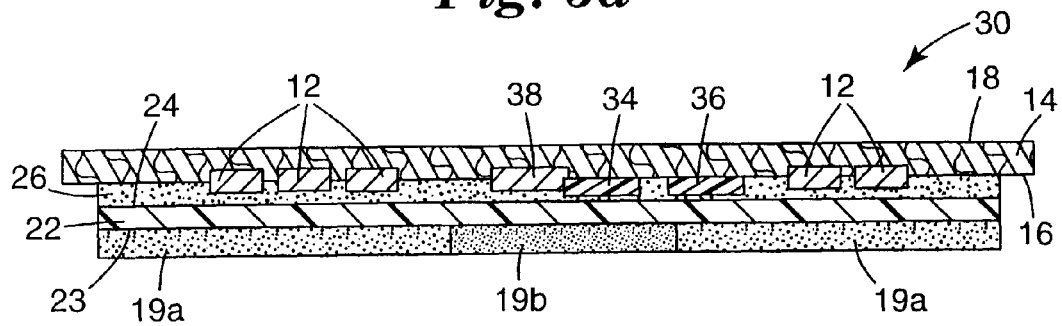
FIG. 3b is cross-sectional view of another embodiment of the tamper-indicating radio frequency identification sticker taken along line 3 in FIG. 2.

FIG. 3b illustrates an alternative RFID sticker 30 including a layer of tamper-indicating optical material 22. The RFID sticker 30 performs in the same manner as the RFID sticker 20 described for its tamper-indicating features. The tamper-indicating optical material 22 includes a first major surface 23 and a second major surface 24 opposite the first major surface 23. The RFID sticker 30 also includes a second layer of adhesive 26. The second layer of adhesive 26 attaches the second major surface 24 of the optical material 22 to the first major surface 16 of the substrate 14. The second layer of adhesive 26 may include all of the characteristics of the first layer of adhesive 19 described above. For example, the second adhesive 26 may include a variety of portions including different adhesive strengths or may be stripe coated or coated in a pattern. The first layer of adhesive 19 described above is attached to the first major surface 23 of the optical material 22 opposite the second adhesive 26.

The tamper-indicating optical material 22 may be any material that visually indicates that the sticker 30 has been tampered with, after the sticker 30 has been applied to a surface. An example of a suitable tamper indication optical material is disclosed in U.S. Pat. No. 6,004,646, "A Color Changeable Device", (Gosselin et al.), which is hereby incorporated by reference. Other examples of suitable tamper-indicating optical materials are taught in U.S. Pat. Nos. 5,510,171, 5,468,540, 5,591,527; and in U.S. Pat. Application Publication 2002/0142121 A1.

In FIG. 3b, the tamper-indicating optical layer 22 is illustrated as attached to the first major surface 16 of the substrate 14 and the densified metal layer 12. However, optical layer 22 may instead be attached to the second major surface 18 of the substrate, opposite the densified metal layer 12, by a second layer of adhesive.

Figure 4A:
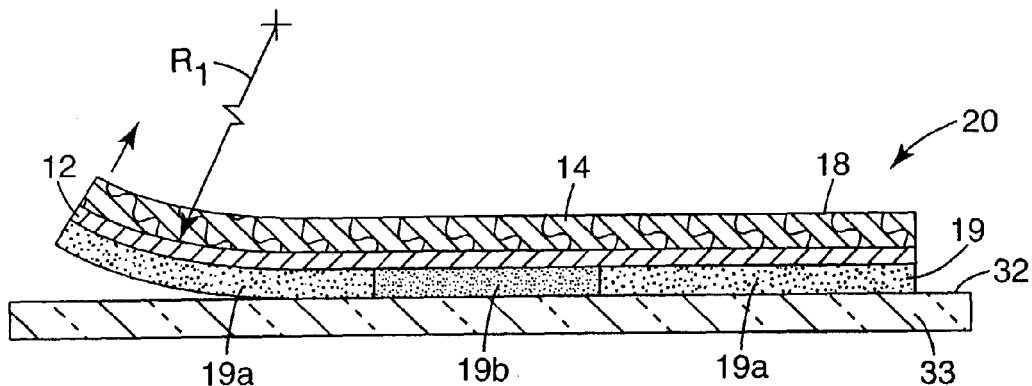
FIG. 4a is cross-sectional view of the tamper-indicating radio frequency identification sticker of FIG. 2 applied to a surface and a portion of the sticker is bent at a radius $R_1$.
Figure 4B:
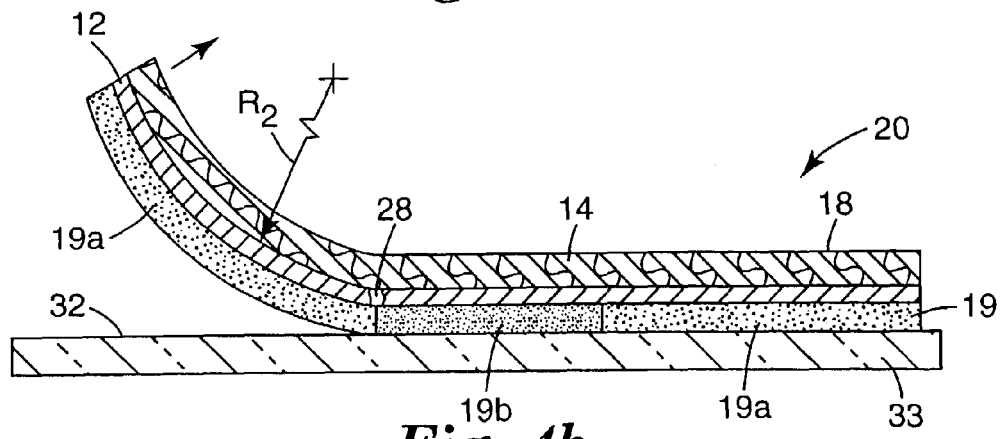

FIGS. 4a and 4b illustrate the ability to indicate that the RFID sticker 20 has been tampered with, after it has been applied to a surface 32. For example, the surface 32 may be a surface of a glass windshield 33. By the term "tamper-indicating," as it is used herein, including the claims, it means to indicate that the attachment of the RFID device 10 or RFID sticker 20 to a surface has been interfered with, tinkered with, altered, modified, or adjusted after the RFID device 10 or RFID sticker 20 has been attached to the surface. One example of how the attachment between the RFID sticker and the surface may be interfered with or how the RFID sticker 20 may be detached from the surface 32 is to bend or fold the densified metal powder layer 12. As illustrated in FIG. 4a, the densified metal powder layer 12 is bent a radius $R_1$. As illustrated in FIG. 4b, the densified metal powder layer 12 may be further bent to a radius $R_2$. This bending motion could be replicated by wrapping the metal powder layer 12 (and with it, the entire sticker 20) around a rod having a diameter equal to twice the distance of $R_1$ or $R_2$, respectively. Preferably, $R_1$ is more than 25 mm. Preferably, $R_2$ is equal to or less than 25 mm more preferably, $R_2$ is equal to or less than 15 mm. Most preferably, $R_2$ is equal to or less than 10 mm. With a smaller radius, the layer 12 is bent at a sharper angle or arc, as compared to a larger radius.

In one preferred embodiment of the RFID sticker 20, before the densified metal powder layer 12 of the antenna is bent, the antenna responds appropriately to a signal sent by an interrogator. By responding appropriately, it is meant that the device 10 either back scattus or re-radiates the sent signal, This signal may be sent before the RFID sticker 20 is adhered to the surface 32 or after the RFID sticker 20 has been properly adhered to the surface 32. One example of an interrogator is sold by 3M Company, located in St. Paul Minn. as a Digital Library Assistant Model 701. After the tamper-indicating radio frequency identification antenna is bent less than or equal to a radius of 25 mm (represented as $R_2$), the antenna does not respond to the signal sent by the interrogator. Preferably, the interrogator sends its signal from a distance greater than 15 cm from the RFID sticker 20. If the antenna of an individual RFID sticker 20 that is adhered to a surface 32 responds appropriately to an interrogator, and at some time later, the antenna of the same RFID sticker 20 does not respond appropriately to an interrogator, then this is an indication that the RFID sticker 20 has been tampered with.

In another preferred embodiment of the RFID sticker 20, before the densified metal powder layer 12 of the antenna is bent, the densified metal powder layer 12 of the antenna includes a resistance, such as 0.01 ohms/cm for a loop antenna. After the densified metal powder layer 12 of the antenna is bent less than or equal to a radius of 25 mm ($R_2$), the resistance of the densified metal powder layer 12 will increase, for instance by a factor of two. Preferably, after the densified metal powder layer 12 of the antenna is bent equal to or less than or equal to a radius of 25 mm, the resistance of the antenna increases significantly, for instant by a factor of ten or even increases infinitely. If the densified metal powder layer 12 of an individual RFID sticker 20 that is adhered to a surface 32 is measured to have a certain resistance, and at some time later, the densified metal powder layer 12 of the same RFID sticker 20 is measured as having a higher resistance, especially a significantly higher resistance, then this is an indication that the RFID sticker 20 has been tampered with.

Conductivity and resistively are inversely related. Higher resistance in a circuit or densified metal layer suggests a lower conductivity and equates to the same level of function in a circuit or densified metal layer. Therefore, a significant increase in resistance usually means a significant decrease in conductivity.

In yet another preferred embodiment of the RFID sticker 20, before the densified metal powder layer 12 of the antenna is bent, the densified metal powder layer 12 of the antenna includes a conductivity. After the densified metal powder layer 12 of antenna is bent less than or equal to a radius of 25 mm ($R_2$), the conductivity of the densified metal powder layer 12 will decrease. Preferably, after the densified metal powder layer 12 of the antenna is bent equal to or less than a radius of 25 mm, the conductivity of the antenna decreases significantly. In some instances, the conductivity decreases so much that the densified metal powder layer 12 of antenna becomes nonconductive. If the densified metal powder layer 12 of an individual RFID sticker 20 that is adhered to a surface 32 is measured to have a certain conductivity, and at some time later, the densified metal powder layer 12 of the same RFID sticker 20 is measured as having a lower conductivity, especially a significantly lower conductivity, then this is an indication that the RFID sticker 20 has been tampered with.

In yet another preferred embodiment of the RFID sticker 20, after the densified metal powder layer 12 of antenna is bent less than or equal to a radius of 25 mm ($R_2$), a crack or fracture 28 forms in the layer 12, as illustrated in FIG. 4*b*. This fracture 28 indicates that the RFID sticker 20 has been tampered with. In this fracture area 28, a plurality of metal particles of layer 12 mechanically separates from each other to the point that a disruption occurs between the particles of the layer of densified metal powder. It is possible that this fracture 28 will be so small that it will not be visible to the naked eye. Also, the fracture 28 may not be visible to the naked eye because it will be hidden from the viewer by the substrate 14. However, this fracture 28 will be enough to cause: 1) the antenna to not respond to an interrogator; 2) the resistance of the densified metal powder layer 12 of the antenna to increase, most likely increase significantly; and/or 3) the conductivity of the densified metal powder layer 12 of the antenna to decrease, most likely decrease significantly or to become nonconductive all together. If the RFID sticker is bent at a radius much less than 25 mm, such as 10 mm, portions of the densified metal powder layer 12 of the antenna will delaminate from the substrate 14.

When the metal powder was originally densified as described above, the metal particles were sufficiently compressed together to enable the flow of electricity through the densified metal powder layer 12. After bending the densified metal powder layer 12 less than or equal to a radius of 25 mm, the area of the fracture 28 becomes un-densified and as a result, electricity cannot flow through the metal layer 12 as it had previously. The metal particles of the powder layer 12 in the fracture area 28 cannot be re-densified simply by straightening the metal layer 12. This is why this mechanism is a good indicator that the RFID antenna or sticker has been tampered with.

Although it is illustrated that the adhesive layer 19 stays with the rest of the RFID sticker 20 as the metal layer 12 is being bent, this is not necessary. Instead, all of the adhesive or a portion of the adhesive layer 19 may reside on the surface 32, as the metal layer is bonded. It is also useful to have an adhesive layer 19 that includes at least two different portions 19*a*, 19*b* with differing adhesive strengths, as described above in reference to FIG. 3*a*. As the RFID sticker 20 is pulled away from the surface 32, the second adhesive 19*b* with its more aggressive adhesive or stronger adhesive strength will require more force to continue the detachment of the RFID sticker from the surface 32, causing the RFID sticker to pull at a sharper radius, and thus, more likely causing the fracture 28 to occur, as described above.

It has been described above that FIGS. 4*a*–4*b* illustrate bending of the densified metal powder layer 12 at a certain radius, and thus, the rest of the RFID sticker 20 is bent along the same or similar radius. Another way in which to describe this motion is to state that the densified metal powder layer 12 is being folded, curled or peeled away from the surface 32 and thus, the rest of the RFID sticker 20 is folded, curled or peeled away in a similar manner.

Figure 5A:
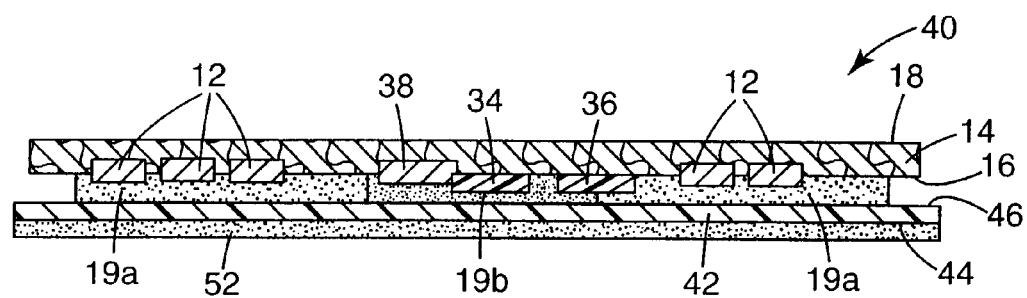
FIG. 5a is a cross-sectional view of an alternative embodiment of the tamper-indicating radio frequency identification sticker taken along line 5 in FIG. 2.

FIG. 5*a* illustrates an alternative RFID sticker 40 including a layer of retroreflective material 42. The RFID sticker 40 performs in the same manner as the RFID sticker 20 described above for its tamper-indicating features. The retroreflective material 42 includes a first major surface 44 and a second major surface 46 opposite the first major surface 44. The first layer of adhesive 19 is attached to the second major surface 46 of the retroreflective material layer 42. The RFID sticker 40 includes a second layer of adhesive 52. The second layer of adhesive 52 attaches the RFID sticker 40 to a surface. The second layer of adhesive 52 may include all of the characteristics of the first layer of adhesive 19 described above. For example, the second adhesive 52 may include a variety of portions including different adhesive strengths or may be stripe coated or coated in a pattern.

Figure 5B:
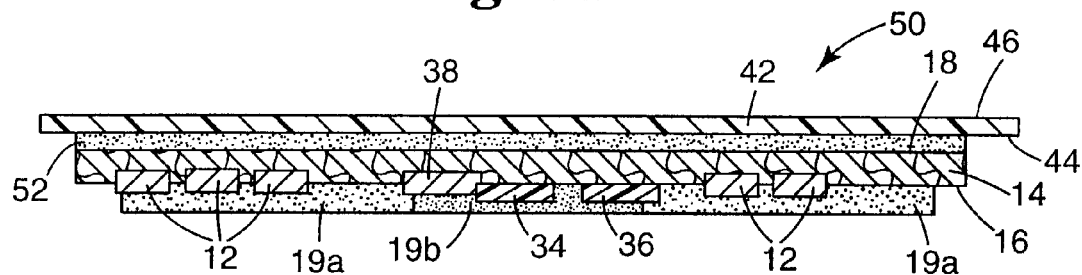
FIG. 5b is a cross-sectional view of another alternative embodiment of the tamper-indicating radio frequency identification sticker taken along line 5 in FIG. 2.

FIG. 5*b* illustrates another alternative RFID sticker 50 including a layer of retroreflective material 42. The RFID sticker 40 performs in the same manner as the RFID sticker 20 described above for its tamper-indicating features. The retroreflective layer 42 is illustrated as attached to the second major surface 18 of the substrate 14, opposite the densified metal layer 12, by the second layer of adhesive 52. As mentioned above, the second layer of adhesive 52 may include all of the characteristics of the first layer of adhesive 19 described above. For example, the second adhesive 52 may include a variety of portions including different adhesive strengths or may be stripe coated or coated in a pattern.

Examples of a suitable retroreflective material are disclosed in U.S. Pat. No. 4,588,258, "Cube-Corner Retroreflective Articles having Wide Angularity in Multiple Viewing Planes, (Hoopman), and U.S. Pat. No. 5,450,235, "Flexible Cube-Corner Retroreflective Sheeting," (Smith et al.), both of which are hereby incorporated by reference. Other examples of suitable retroreflective materials are taught in U.S. Pat. Nos. 3,190,178 and 2,407,680.

Figure 6A:
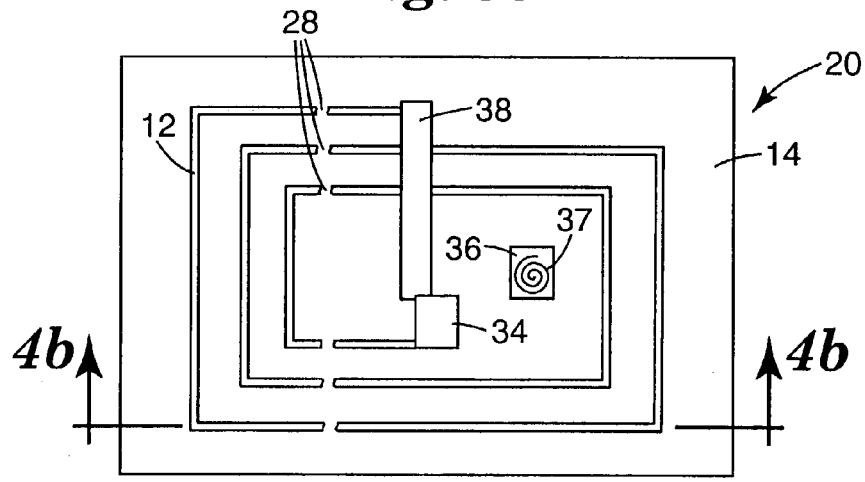
FIG. 6a is a top view of the tamper-indicating radio frequency identification sticker of FIG. 4b with the adhesive layer removed for clarity.

FIG. 6a illustrates a top view of the RFID sticker 20 (with the layer of adhesive removed for clarity) after the sticker 20 has been bent equal to or less than a radius of 25 mm. As illustrated, the densified metal powder layer 12 includes several fractures 28. These fractures 28 are illustrated as so severe that for purposes of illustration a gap is shown in the densified powder material 12. The location of the fractures 28 in row help indicate how far the leading edge of the sticker 20 had been folded away from the substrate.

Figure 6B:
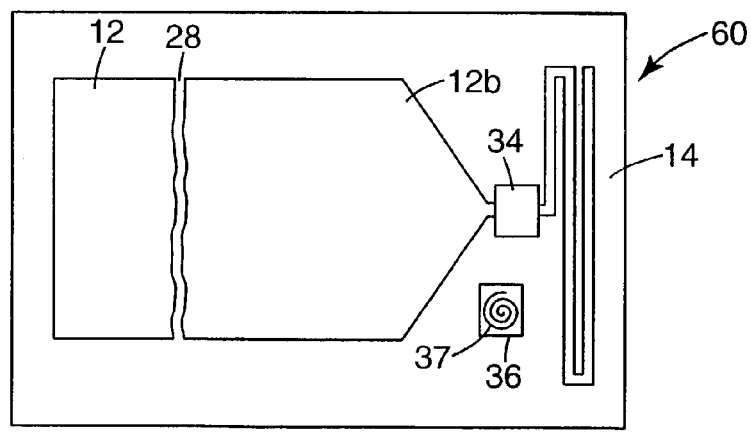
FIG. 6b a top view of another embodiment of a tamper-indicating radio frequency identification sticker with the adhesive layer removed for clarity.

FIG. 6b illustrates another embodiment of an RFID sticker 60. The RFID sticker 60 is the same as the RFID sticker 20 described above, except the densified metal powder layer is in the shape of a dipole antenna, instead of a loop antenna. The fracture 28 is a series of fractures all in a row.

In any of the embodiments of the RFID sticker described above, the RFID sticker may include an optional second integrated circuit 36. Preferably, this second integrated circuit 36 includes its own individual antenna 37. The second integrated circuit 36 may already be read at a distance proportional to the size of the antenna 37. It is particularly useful to have two integrated circuits on an RFID sticker, so that if the first integrated circuit 34 fails to function because its accompanying antenna 12 is folded less than or equal to a radius of 25 mm, then the second integrated circuit 36 can still function, and thus the RFID sticker may be read by an interrogator. It is possible that the second integrated circuit 36 could respond to a signal from an interrogator in one manner or could contain one set of information, whereas the first integrated circuit 34 could respond to a signal from an interrogator in a different manner or could contain a second set of information. If the first and second integrated circuits 34, 36 of an individual RFID sticker 60 that is adhered to a surface 32 and both circuits 34, 36 may be read by an interrogator, and at some time later, the first integrated circuit 34 cannot be read by an interrogator, but the second integrated circuit 36 can be read by the interrogator, then this is an indication that the RFID sticker 60 has been tampered with.

There are several uses of the RFID antennas 10 and RFID stickers 20, 30, 40, 50, 60 described herein. For example, the RFID antennas or stickers may be applied to a first surface, then removed from the first surface, and tested for tampering, as described above. As another example, the RFID antennas or stickers may be applied to a first surface, removed from the first surface, applied to a second surface, and tested for tampering, as described above. The RFID antennas and RFID stickers are for asset identification and tracking and are particularly useful for providing additional protection against fraud or counterfeiting of those assets.

All of the RFID stickers 20, 30, 40 50 may include an optional liner for covering the layer of adhesive until a user is ready to adhere the sticker to a surface.

The present invention has now been described with reference to several embodiments thereof. The foregoing detailed description and examples have been given for clarity of understanding only. No unnecessary limitations are to be understood therefrom. All patents and patent applications cited herein are hereby incorporated by reference. It will be apparent to those skilled in the art that many changes can be made in the embodiments described without departing from the scope of the invention. Thus, the scope of the present invention should not be limited to the exact details and structures described herein, but rather by the structures described by the language of the claims, and the equivalents of those structures.

What is claimed is:

1. A tamper-indicating radio frequency identification device, comprising:
   a substrate including a first major surface and a second major surface opposite the first major surface; and
   a radio frequency identification antenna attached to the first major surface of the substrate, wherein said antenna comprises densified metal powder.

2. The tamper-indicating radio frequency identification device of claim 1, wherein the antenna responds to a signal, and wherein after the tamper-indicating radio frequency identification antenna is bent equal to or less than a radius of 25 mm, the tamper-indicating radio frequency identification antenna does not respond to the signal.

3. The tamper-indicating radio frequency identification device of claim 2, wherein the signal is sent a distance greater than 15 cm from the tamper-indicating radio frequency identification antenna.

4. The tamper-indicating radio frequency identification device of claim 1, wherein the antenna is readable by an interrogator, and wherein after the tamper-indicating radio frequency identification antenna is bent equal to or less than a radius of 25 mm, the tamper-indicating radio frequency identification antenna is not readable by the interrogator.

5. The tamper-indicating radio frequency identification device of claim 4, wherein the interrogator is at distance greater than 15 cm from the antenna.

6. The tamper-indicating radio frequency identification device of claim 1, wherein the antenna includes a resistance, and wherein the resistance of the antenna increases when the antenna is bent equal to or less than a radius of 25 mm.

7. The tamper-indicating radio frequency identification device of claim 6, wherein the resistance of the antenna significantly increases when the antenna is bent equal to or less than a radius of 25 mm.

8. The tamper-indicating radio frequency identification device of claim 1, wherein the conductivity of the antenna is reduced when the antenna is bent equal to or less than a radius of 25 mm.

9. The tamper-indicating radio frequency identification device of claim 1, wherein the conductivity of the antenna is significantly reduced when the antenna is bent equal to or less than a radius of 25 mm.

10. The tamper-indicating radio frequency identification device of claim 1, wherein the antenna is conductive, and wherein the antenna is nonconductive after the antenna is bent equal to or less than a radius of 25 mm.

11. The tamper-indicating radio frequency identification device of claim 1, wherein after the antenna is bent equal to or less than a radius of 25 mm, the antenna comprises a fracture.

12. The tamper-indicating radio frequency identification device of claim 11, wherein the fracture is small or hidden by the substrate so that it is not visible to the naked eye.

13. The tamper-indicating radio frequency identification device of claim 1, wherein the antenna comprises a conductive pattern, and wherein the conductive pattern delaminates after the antenna is bent equal to or less than a radius of 25 mm.

14. The tamper-indicating radio frequency identification device of claim 1, wherein the substrate is selected from the group consisting of paper and materials that are at least about 10% compressible.

15. The tamper-indicating radio frequency identification device of claim 14, wherein the materials that are at least 10% compressible are selected from the group consisting of microporous materials, nonwoven materials and woven materials.

16. The tamper-indicating radio frequency identification device of claim 1, wherein the densified metal powder is selected from the group consisting of copper, tin, lead, silver, gold, platinum, aluminum, nickel, iron, steel, zinc and alloys and combinations thereof.

17. The tamper-indicating radio frequency identification device of claim 1, wherein the antenna is a loop antenna.

18. The tamper-indicating radio frequency identification device of claim 1, wherein the antenna is a dipole antenna.

19. The tamper-indicating radio frequency identification device of claim 1 further comprising a protective layer on the antenna.

20. A tamper-indicating radio frequency identification sticker, comprising:
    a substrate including a first major surface and a second major surface opposite the first major surface; and
    a radio frequency identification antenna attached to the first major surface of the substrate, wherein said antenna comprises densified metal powder;
    a first integrated circuit attached to the antenna; and
    a first layer of adhesive attached to the substrate.

21. The tamper-indicating radio frequency identification sticker of claim 20, wherein the first layer of adhesive is attached to the second major surface of the substrate.

22. The tamper-indicating radio frequency identification sticker of claim 20 further comprising a layer of retroreflective material including a first major surface and a second major surface opposite the first major surface, wherein the first major surface is attached to the first layer of adhesive.

23. The tamper-indicating radio frequency identification sticker of claim 22 further comprising a second layer of adhesive attached to the second major surface on of the layer of retroreflective material.

24. The tamper-indicating radio frequency identification sticker of claim 23 further comprising a liner on the second layer of adhesive.

25. The tamper-indicating radio frequency identification sticker of claim 20, wherein the first layer of adhesive is attached to the antenna.

26. The tamper-indicating radio frequency identification sticker of claim 25 further comprising a layer of retroreflective material including a first major surface and a second major surface opposite the first major surface, wherein the second major surface is attached to the first layer of adhesive.

27. The tamper-indicating radio frequency identification sticker of claim 22 further comprising a second layer of adhesive attached to the second major surface on of the layer of retroreflective material.

28. The tamper-indicating radio frequency identification sticker of claim 27 further comprising a liner on the second layer of adhesive.

29. The tamper-indicating radio frequency identification sticker of claim 20 further comprising a layer of retroreflective material attached adjacent to the sticker.

30. The tamper-indicating radio frequency identification sticker of claim 20 further comprising an indicia printed on the sticker.

31. The tamper-indicating radio frequency identification sticker of claim 20, wherein the first adhesive layer comprises a first adhesive portion and a second adhesive portion, wherein the first adhesive portion includes a first adhesion strength, wherein the second adhesive portion includes a second adhesive strength, and wherein the second adhesive strength is greater than the first adhesive strength.

32. The tamper-indicating radio frequency identification sticker of claim 20 further comprising a layer of tamper-indicating optical material attached to the sticker.

33. The tamper-indicating radio frequency identification sticker of claim 32, wherein the layer of tamper-indicating optical material includes a first major surface and a second major surface opposite the first major surface, and wherein the first layer of adhesive is attached to the second major surface onto substrate and is attached to the first major surface of the layer of tamper-indicating optical material.

34. The tamper-indicating radio frequency identifications ticker of claim 32, wherein the layer of tamper-indicating optical material includes a first major surface and a second major surface opposite the first major surface, and wherein the first layer of adhesive is attached to the antenna and is attached to the second major surface of the layer of tamper-indicating optical material.

35. The tamper-indicating radio frequency identification sticker of claim 32, wherein after the sticker is removed from a surface, the layer of tamper-indicating optical material visibly indicates the sticker was removed from the surface.

36. The tamper-indicating radio frequency identification sticker of claim 20 further comprising
    a second integrated circuit attached to the substrate, wherein the second integrated circuit includes an antenna.

37. The tamper-indicating radio frequency identification sticker of claim 36, wherein the second integrated circuit comprises a radio frequency identification antenna.

38. The tamper-indicating radio frequency identification sticker of claim 20, wherein the antenna responds to a signal, and wherein after the tamper-indicating radio frequency identification antenna is bent equal to or less than a radius of 25 mm, the tamper-indicating radio frequency identification antenna does not respond to the signal.

39. The tamper-indicating radio frequency identification sticker of claim 38, wherein the signal is sent from a distance greater than 15 mm.

40. The tamper-indicating radio frequency identification sticker of claim 20, wherein the antenna is readable by an interogator, and wherein after the tamper-indicating radio frequency identification antenna is bent equal to or less than a radius of 25 mm, the tamper-indicating radio frequency identification antenna is not readable by the interrogator.

41. The tamper-indicating radio frequency identification sticker of claim 40, wherein the interrogator is at distance greater than 15 cm from the antenna.

42. The tamper-indicating radio frequency identification sticker of claim 20, wherein the antenna includes a resistance, and wherein the resistance of the antenna increases when the antenna is bent equal to or less than a radius of 25 mm.

43. The tamper-indicating radio frequency identification sticker of claim 42, wherein the resistance of the antenna is significantly increases when the antenna is bent equal to or less than a radius of 25 mm.

44. The tamper-indicating radio frequency identification slicker of claim 20, wherein the conductivity of the antenna is reduced when the antenna is bent equal to or less then a radius of 25 mm.

45. The tamper-indicating radio frequency identification sticker of claim 44, wherein the conductivity of the antenna is significantly reduced when the antenna is bent equal to or less than a radius of 25 mm.

46. The tamper-indicating radio frequency identification sticker of claim 45, wherein the antenna is conductive, and wherein the antenna is nonconductive after the antenna is bent equal to or less than a radius of 25 mm.

47. The tamper-indicating radio frequency identification slicker of claim 20, wherein after the antenna is bent equal to or less than a radius of 25 mm, the antenna comprises a fracture.

48. The tamper-indicating radio frequency identification sticker of claim 47, wherein the fracture is not visible to the naked eye.

49. The tamper-indicating radio frequency identification sticker of claim 20, wherein the antenna comprises a conductive pattern, and wherein the conductive pattern delaminates alter the antenna is bent equal to or less than a radius of 25 mm.

50. A method of indicating a radio frequency identification sticker has been tampered, comprising steps of:
attaching a tamper-indicating radio frequency identification sticker to a first surface, wherein the tamper-indicating radio frequency identification sticker, comprises:
a substrate including a first major surface and a second major surface opposite the first major surface;
a radio frequency identification antenna attached to the first major surface of the substrate, wherein said antenna comprises densified metal powder;
a first integrated circuit attached to the antenna; and
a first layer of adhesive attached to the substrate;
sending a signal to the tamper-indicating radio frequency identification sticker attached to the first surface;
receiving a response from the antenna;
removing the tamper-indicating radio frequency identification sticker from the first surface; and
sending the signal to the tamper-indicating radio frequency identification sticker and not receiving a response from the antenna.

51. The method of claim 50, wherein the removing step comprises bending the tamper-indicating radio frequency identification antenna less than a radius of 25 mm.

52. The method of claim 50, wherein the sending step comprises sending the signal from a distance greater than 15 cm from the tamper-indicating radio frequency identification sticker.

53. The method of claim 50, comprising after the removing step, the step of: attaching the tamper-indicating radio frequency identification sticker to a second surface.

54. The method of indicating a radio frequency identification sticker has been tampered, comprising the steps of:
attaching a tamper-indicating radio frequency identification sticker to a first surface, wherein the tamper-indicating radio frequency identification sticker, comprises:
a substrate including a first major surface and a second major surface opposite the first major surface;
a radio frequency identification antenna attached to the first major surface of the substrate, wherein said antenna comprises densified metal powder;
a first integrated circuit attached to the antenna; and
a first layer of adhesive attached to the substrate;
measuring a first resistance in the antenna;
bending the tamper-indicating radio frequency identification sticker less than a radius of 25 mm; and
measuring a second resistance in the antenna that is higher than the first resistance of the antenna.

55. The method of claim 54, wherein the second resistance in the antenna is significantly higher than the first resistance of the antenna.

56. The method of claim 54 wherein the bending step comprises removing the tamper-indicating radio frequency identification sticker front the first surface.

57. The method of claim 56, further comprising, after the bending and removing step, the step of:
attaching the tamper-indicating radio frequency identification sticker to second surface.

58. A method of indicating a radio frequency identification sticker has been tampered, comprising the steps of:
attaching a tamper-indicating radio frequency identification sticker to a first surface, wherein the tamper-indicating radio frequency identification sticker, comprises:
a substrate including a first major surface and a second major surface opposite the first major surface;
a radio frequency identification antenna attached to the first major surface of the substrate, wherein said antenna comprises densified metal powder;
a first integrated circuit attached to the antenna; and
a first layer of adhesive attached to the substrate;
measuring a first conductivity in the antenna;
bending the tamper-indicating radio frequency identification sticker less than or equal to a radius of 25 mm; and
measuring a second conductivity in the antenna that is lower than the first conductivity of the antenna.

59. The method of claim 58, wherein the second conductivity in the antenna is significantly lower than the first conductivity of the antenna.

60. The method of claim 58 wherein the bending step comprises removing the tamper-indicating radio frequency identification sticker from the first surface.

61. The method of claim 60, further comprising, after the bending and removing step, the step of:
attaching the tamper-indicating radio frequency identification slicker to a second surface.

62. A method of indicating a radio frequency identification sticker has been tampered, comprising the steps of:
attaching a tamper-indicating radio frequency identification sticker to a first surface, wherein the tamper-indicating radio frequency identification sticker, comprises:
a substrate including a first major surface and a second major surface opposite the first major surface;
a radio frequency identification antenna attached to the first major surface of the substrate, wherein said antenna comprises densified metal powder;
a first integrated circuit attached to the antenna; and
a first layer of adhesive attached to the substrate;
measuring a first conductivity in the antenna;
bending the tamper-indicating radio frequency identification sticker less than or equal to a radius of 25 mm; and
measuring a second conductivity that indicates that the antenna is nonconductive.

63. The method of claim 62 wherein the bending step comprises removing the tamper-indicating radio frequency identification sticker from the first surface.

64. The method of claim 63, further comprising, after the bending and removing step, the step of:
attaching the tamper-indicating radio frequency identification sticker to a second surface.

65. A method of indicating a radio frequency identification sticker has been tampered, comprising the steps of:
attaching a tamper-indicating radio frequency identification sticker to a first surface, wherein the tamper-indicating radio frequency identification sticker, comprises:
a substrate including a first major surface and a second major surface opposite the first major surface;
a radio frequency identification antenna attached to the first major surface of the substrate wherein said antenna comprises densified metal powder;
a first integrated circuit attached to the antenna; and
a first layer of adhesive attached to the substrate;
bending the tamper-indicating radio frequency identification sticker less than or equal to a radius of 25 mm; and
forming a fracture in the radio frequency identification antenna.

66. The method of claim 65 wherein the bending step comprises removing the tamper-indicating radio frequency identification sticker from the first surface.

67. The method of claim 66, further comprising, after the bending and removing step, the step of;
attaching the tamper-indicating radio frequency identification sticker to a second surface.

68. A method of indicating a radio frequency identification sticker has been tampered, comprising the steps of:
attaching a tamper-indicating radio frequency identification sticker to a first surface, wherein the tamper-indicating radio frequency identification sticker, comprises:
a substrate including a first major surface and a second major surface opposite the first major surface;
a first radio frequency identification antenna attached to the first major surface of the substrate, wherein said antenna comprises densified metal powder;
a first integrated circuit attached to the antenna;
a second integrated circuit attached to the substrate, wherein the second integrated circuit comprises a second antenna; and
a first layer of adhesive attached to the substrate;
sending a signal to the tamper-indicating radio frequency identification sticker attached to the first surface;
receiving a response from the first antenna and from the second antenna;
removing the tamper-indicating radio frequency identification sticker from the first surface;
sending the signal to the tamper-indicating radio frequency identification sticker; and
receiving a signal from the second antenna and not receiving a response from the first antenna.

69. The method of claim 63, further comprising, after the removing step, the step of:
attaching the tamper-indicating radio frequency identification sticker to a second surface.

70. A tamper-indicating radio frequency identification sticker, comprising:
a substrate including a first major surface and a second major surface opposite the first major surface, wherein the substrate is selected from the group consisting of paper and materials that are at least about 10% compressible, and wherein the materials that are at least 10% compressible are selected from the group consisting of microporous materials, nonwoven materials and woven materials; and
a radio frequency identification loop antenna attached to the first major surface of the substrate, wherein said antenna comprises densified metal powder, wherein the densified metal powder is selected from the group consisting of copper, tin, lead, silver, gold, platinum, aluminum, nickel, iron, steel, zinc and alloys and combinations thereof; and
wherein the metal powder comprises metal particles in the shape of spheres, oblongs, and polyhedra;
a first integrated circuit attached to the antenna; and
a first layer of adhesive attached to the substrate;
wherein the antenna responds to a signal sent a distance greater than 15 cm from the tamper-indicating radio frequency identification sticker, and wherein after the tamper-indicating radio frequency identification sticker is bent equal to or less than a radius of 25 mm, the tamper-indicating radio frequency identification loop antenna does not respond to the signal and the antenna comprises a fracture that is not visible to the naked eye.

71. A radio frequency identification antenna, comprising:
a substrate including a first major surface and a second major surface opposite the first major surface; and
a radio frequency identification antenna attached to the first major surface of the substrate, wherein said antenna comprises densified metal powder.

72. The radio frequency identification antenna of claim 71, wherein the substrate is selected from the group consisting of paper and materials that are at least about 10% compressible.

73. The radio frequency identification antenna of claim 72, wherein the materials that are at least 10% compressible are selected from the group consisting of microporous materials, nonwoven materials and woven materials.

74. The radio frequency identification antenna of claim 71, wherein the densified metal powder is selected from the group consisting of copper, tin, lead, silver, gold, platinum, aluminum, nickel, iron, steel, zinc and alloys and combinations thereof.

75. The radio frequency identification antenna of claim 71, wherein the antenna is a loop antenna.

76. The radio frequency identification antenna of claim 71, wherein the antenna is a dipole antenna.

77. The radio frequency identification antenna of claim 71 further comprising a protective layer on the antenna.

78. A radio frequency identification sticker comprising a radio frequency identification antenna of claim 71, and further comprising:
a first integrated circuit attached to the antenna; and
a first layer of adhesive attached to the substrate.

79. The A radio frequency identification sticker of claim 78, further comprising a layer of retroreflective material including a first major surface and a second major surface opposite the first major surface, wherein the second major surface is attached to the first layer of adhesive.

* * * * *

UNITED STATES PATENT AND TRADEMARK OFFICE
CERTIFICATE OF CORRECTION

PATENT NO. : 7,102,522 B2
APPLICATION NO. : 10/328989
DATED : September 5, 2006
INVENTOR(S) : David W. Kuhns It is certified that error appears in the above-identified patent and that said Letters Patent is hereby corrected as shown below:

Column 1,
Line 61, delete "tamper indicating" and insert -- tamper-indicating --.

Column 6,
Line 44, delete "on)" and insert -- on --.

Column 8,
Line 9, delete "2000 um" and insert -- 2000 μm --.
Line 9, delete "0.2 um" and insert -- 0.2 μm --.
Line 10, delete "1000 um" and insert -- 1000 μm --.
Line 10, delete "1 um" and insert -- 1 μm --.
Line 11, delete "500 um" and insert -- 500 μm --.

Column 9,
Line 12, delete "cm$^2$.)" and insert -- cm$^2$. --.

Column 16,
Line 19, delete "onto" and insert -- of the --.
Lines 21-22, delete "identifications ticker" and insert -- identification sticker --.
Line 49, delete "mm." and insert -- cm. --.
Line 52, delete "interogator," and insert -- interrogator, --.

Column 17,
Line 2, delete "slicker" and insert -- sticker --.
Line 3, delete "then" and insert -- than --.
Line 14, delete "slicker" and insert -- sticker --.
Line 23, delete "alter" and insert -- after --.

Column 18,
Line 13, delete "front" and insert --from --.
Line 46, delete "slicker" and insert -- sticker --.

UNITED STATES PATENT AND TRADEMARK OFFICE
CERTIFICATE OF CORRECTION

PATENT NO. : 7,102,522 B2
APPLICATION NO. : 10/328989
DATED : September 5, 2006
INVENTOR(S) : David W. Kuhns It is certified that error appears in the above-identified patent and that said Letters Patent is hereby corrected as shown below:

Column 19,
Line 14, after "substrate" insert -- , --.
Line 26, delete "of;" and insert --of: --.

Column 20,
Line 56, delete "The" before "A".

Signed and Sealed this

Twelfth Day of December, 2006

JON W. DUDAS
*Director of the United States Patent and Trademark Office*